United States Patent
Watanabe et al.

(10) Patent No.: US 6,795,471 B2
(45) Date of Patent: Sep. 21, 2004

(54) GROUP III NITRIDE COMPOUND SEMICONDUCTOR LASER AND MANUFACTURING METHOD THEREOF

(75) Inventors: Atsushi Watanabe, Tsurugashima (JP); Yoshinori Kimura, Tsurugashima (JP); Hiroyuki Ota, Tsurugashima (JP); Toshiyuki Tanaka, Tsurugashima (JP); Hirokazu Takahashi, Tsurugashima (JP); Mamoru Miyachi, Tsurugashima (JP); Atsuya Ito, Tsurugashima (JP)

(73) Assignee: Pioneer Corporation, Tokyo (JP)

( * ) Notice: Subject to any disclaimer, the term of this patent is extended or adjusted under 35 U.S.C. 154(b) by 0 days.

(21) Appl. No.: 10/117,095

(22) Filed: Apr. 8, 2002

(65) Prior Publication Data

US 2002/0150136 A1 Oct. 17, 2002

(30) Foreign Application Priority Data

Apr. 12, 2001 (JP) ........................... 2001-113904

(51) Int. Cl.$^7$ ............................................... H01S 5/00
(52) U.S. Cl. ............................................ 372/46; 372/45
(58) Field of Search .......................... 372/43, 45, 46, 372/47, 50; 438/22; 257/97, 99, 103, 191

(56) References Cited

U.S. PATENT DOCUMENTS

| | | | | |
|---|---|---|---|---|
| 5,684,309 A | * | 11/1997 | McIntosh et al. | ........... 257/191 |
| 5,929,466 A | * | 7/1999 | Ohba et al. | ................. 257/103 |
| 5,987,048 A | * | 11/1999 | Ishikawa et al. | .............. 372/46 |
| 6,266,355 B1 | * | 7/2001 | Sverdlov | ....................... 372/45 |
| 6,359,919 B1 | * | 3/2002 | Ishikawa et al. | .............. 372/45 |
| 6,365,921 B1 | * | 4/2002 | Watanabe et al. | ............. 257/97 |
| 6,411,636 B1 | * | 6/2002 | Ota et al. | ...................... 372/43 |
| 6,515,311 B1 | * | 2/2003 | Nishitsuka et al. | ........... 257/99 |

* cited by examiner

*Primary Examiner*—Hoang V. Nguyen
*Assistant Examiner*—Tuan N. Nguyen
(74) *Attorney, Agent, or Firm*—Sughrue Mion, PLLC

(57) ABSTRACT

A nitride compound semiconductor laser, of which driving voltage is low and transverse mode of light is stable, having a plurality of crystal layers made of a group III nitride compound semiconductor expressed by the formula $(AlGa_{1-x})_{1-y}In_yN$ ($0 \leq x \leq 1$, $0 \leq y \leq 1$). The layers include an active layer-side guide layer which is adjacent to an active layer in the crystal layers of the group III nitride compound semiconductor and made of $Al_{x'}Ga_{1-x'-y'}In_{y'}N$ ($0 \leq x' \leq 1$, $0 \leq y' \leq 1$), a current constricting AlN layer deposited on said guide layer and having a stripe-shape aperture, an electrode-side guide layer made of $Al_{x''}Ga_{1-x''-y''}In_{y''}N$ ($0 \leq x'' \leq 1$, $0 \leq y'' \leq 1$) and deposited filling the aperture of the current constricting layer, and a clad layer made of $Al_uGa_{1-u-v}In_vN$ ($0 \leq u \leq 1$, $0 \leq v \leq 1$) and deposited on the electrode-side guide layer.

15 Claims, 5 Drawing Sheets

— DEVICE OF THE EMBODIMENT
--- DEVICE OF THE COMPARATIVE EXAMPLE

GROUP III NITRIDE COMPOUND SEMICONDUCTOR LASER AND MANUFACTURING METHOD THEREOF

BACKGROUND OF THE INVENTION

1. Field of the Invention

This invention relates to a nitride compound semiconductor laser (hereafter, may be simply referred to device) having a plurality of crystal layers of group III nitride compound semiconductor expressed by the formula $(Al_xGa_{1-x})_{1-y}In_yN$ ($0 \leq x \leq 1$, $0 \leq y \leq 1$), to which carriers are supplied from electrodes. More specifically, this invention relates to a group III nitride compound semiconductor laser that can emit laser light of wavelengths ranging from ultra-violet to blue and to a method for manufacturing the same.

2. Description of Related Art

A number of possible structures for semiconductor laser have been proposed over the years. Many of them include structures for limiting the area for current injection in the direction parallel to the pn junction, namely transverse direction, and those for confining light generated in the active layer in the transverse direction. Those structures typically break down into two types: the ridge-type, namely mesa-stripe type; and the inner stripe type, namely the internal current flow restriction type.

The ridge-type semiconductor laser has the so-called ridge-type structure in which a stripe-shape narrow bump is formed in a region above a p-type guide layer and a p-side electrode is formed on this bump. The device of this type needs a high-precision process of the ridge structure. This process consists of numerous steps and makes it difficult to improve the manufacturing yield of the device. This is because the dimensions of the ridge structure significantly influence the threshold current for oscillation and light-beam quality.

Meanwhile, Japanese Patent Kokai No. Hei. 11-261160 discloses a group III nitride compound semiconductor laser of an inner stripe type that has a pair of clad layers, an active layer sandwiched between the clad layers and a current constricting layer having a stripe-shape aperture serving as the path for current over the active layer. This current constricting layer is a highly resistant layer that is fabricated by heating an amorphous or poly-crystalline nitride compound semiconductor layer and then crystallizing this layer. This current constricting layer is made of GaN containing impurities at least $1 \times 10^{20}$ cm$^{-3}$. The light is confined in the transverse direction by utilizing the light absorption effect relevant to the impurity energy states in this layer.

However, the clad layer over the aperture of the current constricting layer is regrown on the uneven (bumpy) underlying layer. As a result, when the p-type nitride compound semiconductor containing group II Mg as an acceptor impurity is regrown on the current constricting layer, the distribution of Mg concentration is not uniform in the semiconductor layer of the aperture and then its electric performance deteriorates.

In the case of nitride compound semiconductors, the satisfactory p-type conduction is realized when the Mg concentration is within a very limited range. Thus if there are fluctuations in the distribution of Mg concentration, the p-type conduction properties deteriorate.

In particular, when a p-type clad layer, which is usually $Al_xGa_{1-x}N$:Mg ($0.05 \leq x \leq 0.20$), is regrown, an inhomogeneous distribution of Mg in the semiconductor layer of the aperture exerts seriously negative effects. That is, a potential barrier to an injection of carriers (in this case, holes) is developed unless the clad layer itself is a uniform p-type layer since the band gap of the clad layer is larger than that of the guide layer. Besides, the series resistance of the device increases due to the rise in the bulk resistance of the p-type AlGaN. Namely, if the semiconductor layer filling the aperture is the Mg-doped AlGaN clad layer, a degradation of the p-type conduction in this layer directly affects the current-voltage properties of the resulting device.

Operating current and voltage can be lowered in the inner stripe type laser since it provides both the restriction of current injection area and the light confinement in the transverse direction at the same time. It shows good performance in controlling the transverse mode of light and may be manufactured at a high productivity. Compared with the ridge type laser, the inner stripe type laser shows better performance in heat dissipation, providing a long life of use and high reliability. Despite these merits, as the aforementioned problems have not been solved, the inner stripe type semiconductor laser using group III nitride compound semiconductor is not popular yet. Only the ridge type group III nitride compound semiconductor laser has been successfully commercialized so far.

OBJECT AND SUMMARY OF THE INVENTION

This invention has been made to solve the problem that the conventional inner stripe type nitride compound semiconductor laser has poor current-voltage properties. An object of the present invention is, therefore, to provide an inner stripe type nitride compound semiconductor laser that can be driven at low current and voltage, easy to manufacture and stable during operation at the transverse mode of light.

The present invention provides a group III nitride compound semiconductor laser that has a pair of opposing guide and clad layers sandwiching an active layer and a current constricting layer located intermediate in a p-type guide layer.

The current constricting layer is made of AlN deposited at low temperatures between 400–600° C. and has a stripe-shape aperture that restricts the area through which current is injected to the active layer. Namely, the nitride compound semiconductor laser according to the present invention is a nitride compound semiconductor laser having a plurality of crystal layers made of a group III nitride compound semiconductor expressed by the formula $(Al_xGa_{1-x})_{1-y}In_yN$ (where $0 \leq x \leq 1$, $0 \leq y \leq 1$), the plurality of crystal layers comprising an active layer-side guide layer which is adjacent to the active layer in the crystal layers of the group III nitride compound semiconductor and made of $Al_{x'}Ga_{1-x'-y'}In_{y'}N$ (where $0 \leq x' \leq 1$, $0 \leq y' \leq 1$), a current constricting AlN layer which is deposited on said guide layer and has a stripe-shape aperture, an electrode-side guide layer which is made of $Al_{x''}Ga_{1-x''-y''}In_{y''}N$ (where $0 \leq x'' \leq 1$, $0 \leq y'' \leq 1$) and deposited filling the aperture of the current constricting layer, and a clad layer which is made of $Al_uGa_{1-u-v}In_vN$ (where $0 \leq u \leq 1$, $0 \leq v \leq 1$) and deposited on the electrode-side guide layer. The current constricting layer can block current effectively in the regions other than the aperture because the electric resistance of the AlN film deposited at low temperatures (400–600° C.) is very high.

In the nitride compound semiconductor laser according to the present invention, if the band gaps of the active layer-side guide layer, the electrode-side guide layer and the clad layer are represented by Eg1, Eg2 and Eg3, respectively, their relations are Eg1 ≤ Eg2 ≤ Eg3.

The guide layer on the active layer side and the guide layer on the electrode side may have the same composition, $Al_xGa_{1-x-y}In_yN$ (where $0 \leq x \leq 1$, $0 \leq y \leq 1$).

A semiconductor layer of $Al_zGa_{1-z}N$ (where $0.05 \leq z \leq 0.3$) may be formed immediately above the active layer of the device in order to protect the active layer and prevent the overflow of electrons.

The film thickness of the current constricting AlN layer is 100–800 Å, preferably 200–600 Å in the present invention. Since the refractive index of the AlN layer is approximately 2.15 and smaller than those of the other regions, an effective step of the refractive index is provided that can confine light in the horizontal direction (transverse direction) parallel to the pn junction in the vicinity of the aperture of the current constricting layer.

If the AlN film becomes thinner than the lower limit, 100 Å, it becomes difficult to effectively confine the light in the transverse direction. The light confinement in the transverse direction according to this invention is different from the conventional one utilizing the current constricting layer where impurities have been heavily doped to provide an appropriate absorption coefficient for the light emitted from the active layer. The present invention utilizes an effective step of the refractive index resulting from an appropriate low refractive index of AlN.

The AlN film deposited at low temperatures is amorphous (non-crystal) and this layer is used as a buffer layer that relaxes mismatching in the lattice constant when growing GaN on the sapphire substrate. Therefore, it is easy to regrow GaN:Mg layer(p-type guide layer) on the low temperature deposited AlN layer. If the AlN film is thicker than the upper limit, 800 Å, it becomes almost impossible to sufficiently flatten by the deposition of the electrode-side guide layer. Group II elements such as Mg are added to the guide layer, and the guide layer comes to show p-type conduction through annealing treatment.

In the present invention, the current constricting layer made of AlN is located inside the p-type guide layer. Thus this structure can avoid the conventional problem that the current-voltage properties deteriorate due to the increase of the electric resistance of the p-type crystal layer within the aperture of the current constricting layer.

The Mg distribution in the p-type crystal layer within the aperture of the current constricting layer becomes inhomogeneous during the growth of the p-type guide layer as well. However, the resulting current-voltage properties of the device are good. This is because the band gap of the guide layer is designed to be smaller than that of the clad layer and a large number of carriers (in this case, holes) can flow into the guide layer from the clad layer to provide a high conductivity for the guide layer when the device is forward-biased. Therefore, if the clad layer is a good p-type layer, a sufficient number of carriers are supplied from the clad layer. This explanation is consistent with the fact that laser oscillation is realized even if the guide layer is undoped. Besides, when the aperture is buried with this p-type guide layer made of GaN:Mg, the inhomogeneity in Mg incorporation works preferably, and a flat surface of buried layer is provided. As a result, the p-type contact layer and the electrode that will be deposited over this buried layer become flat as well. Then the semiconductor laser of the inner stripe type according to the present invention provides another merit that it is easy to attain a thermally preferable contact when mounting the device on a heat sink with its p-side down.

Moreover, AlN has a merit in terms of heat dissipation because it has a thermal conductivity of 285W/mK around at room temperature, which is more than twice the thermal conductivity of GaN, 130 W/mK. This feature of AlN is a merit whether the device is mounted on the heat sink with the p-side up or p-side down, thus contributing to a longer life of use.

A manufacturing method according to the present invention for a nitride compound semiconductor laser having a plurality of crystal layers made of a group III nitride compound semiconductor expressed by the formula $(Al_xGa_{1-x})_{1-y}In_yN$ (where $0 \leq x \leq 1$, $0 \leq y \leq 1$), comprising the steps of forming an active layer-side guide layer that is adjacent to the active layer made of the group III nitride compound semiconductor and made of $Al_{x'}Ga_{1-x'-y'}In_{y'}N$ (where $0 \leq x' \leq 1$, $0 \leq y' \leq 1$), forming a current constricting AlN layer that is deposited on said active layer-side guide layer and has a stripe-shape aperture, filling said current constricting layer with an electrode-side guide layer made of $Al_{x''}Ga_{1-x''-y''}In_{y''}N$ (where $0 \leq x'' \leq 1$, $0 \leq y'' \leq 1$), and forming a clad layer made of $Al_uGa_{1-u-v}In_vN(0 \leq u \leq 1, 0 \leq v \leq 1)$ on the electrode-side guide layer. The current constricting layer made of AlN can be etched by wet process and it is easy to form the aperture. With respect to this feature, the device manufacturing method disclosed in Japanese Patent Kokai No. Hei. 11-261160 describes that the etching becomes difficult to perform when forming a $Ga_xAl_yIn_{1-x-y}N(0 \leq x, y \leq 1)$ film if its Al content is high because of its higher etching-resistance. However, we have found that, contrary to this disclosure, it is possible to easily wet-etch AlN that was deposited at temperatures between 400–600° C. with an alkaline solution kept at appropriately 80° C. or phosphoric acid-base etching solution kept at 150–200° C. The wet etching of AlN formed on the p-type GaN provides a highly clean surface. Thus when the p-type guide layer is regrown after the aperture formation, the interface resulting from this film regrowth does not work as a barrier that contains too many impurities. There is no degradation in the current-voltage properties of the device. The growth of these crystal layers is conducted by the metalorganic chemical vapor deposition method.

DETAILED DESCRIPTION OF THE PREFERRED EMBODIMENTS

Embodiments of a group III nitride compound semiconductor laser according to the present invention are described below with reference to the accompanying drawings.

Figure 1:
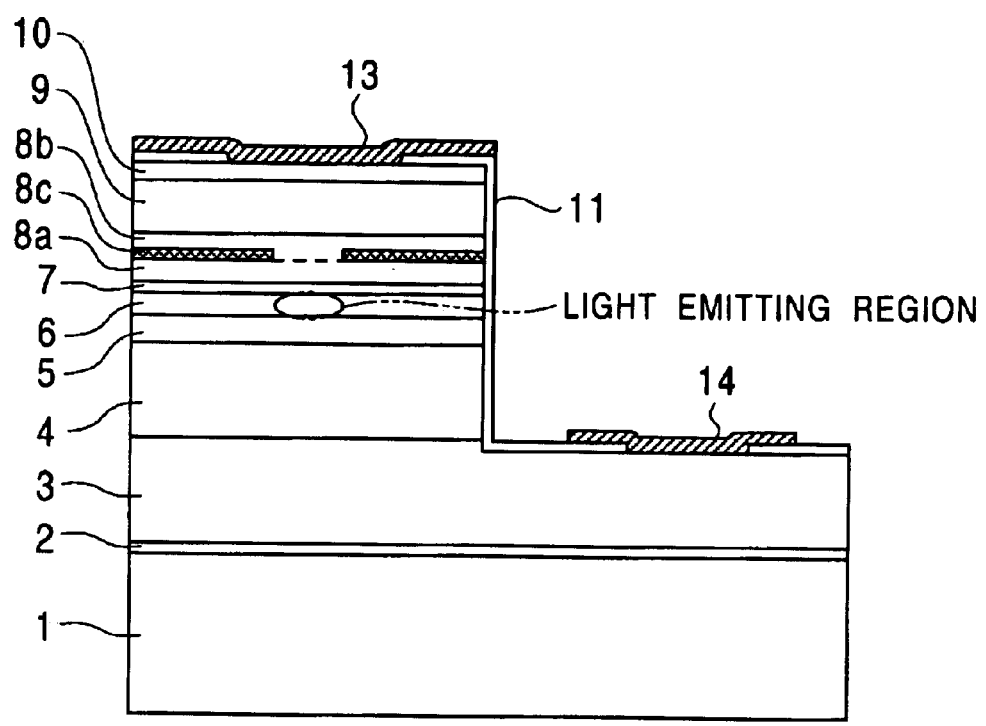
FIG. 1 is a schematic sectional view of an inner stripe type nitride compound semiconductor laser according to an embodiment of the present invention.

FIG. 1 shows an example of semiconductor lasers using group III nitride compound semiconductor, which is an inner stripe type laser device of the separate confinement heterostructure (SCH). Denoted 1 is a single-crystal sapphire substrate, 2 a GaN (or AlN) buffer layer deposited at low temperatures, 3 an n-type GaN contact layer, 4 an n-type $Al_{0.08}Ga_{0.92}N$ clad layer, 5 an n-type GaN guide layer, 6 an active layer of, for example, the multiple quantum well (MQW) structure having InGaN as the major constituting element, 7 a p-type $Al_{0.2}Ga_{0.8}N$ electron barrier layer or cap layer, 8a a p-type GaN guide layer on the active layer side, 8c a current constricting AlN layer, 8b a p-type GaN guide layer on the electrode side, 9 a p-type $Al_{0.08}Ga_{0.92}N$ clad layer, 10 a p-type GaN contact layer where group II impurities such as Mg are doped, 11 a dielectric layer made of $SiO_2$, 13 a p-side electrode, and 14 an n-side electrode.

In this device, the active layer 6 emits light when electrons and holes supplied from the electrodes recombine each other. The n-type and p-type GaN guide layers 5, 8a, 8b guide the light generated in the active layer 6. The electrons and holes are effectively confined in the active layer 6 by controlling the band gaps of the guide layers to be larger than that of the active layer 6. The p-type electron barrier layer or cap layer 7 is the barrier layer that strengthens the confinement of injected carriers (particularly, electrons) and may prevent the vaporization of the active layer when the active layer 6 grown at 700–800° C. is heated up to 1000–1100° C. Since the refractive indices of the n-type and p-type clad layers 4, 9 are lower than those of the guide layers 5, 8, the generated light is guided by the step in refractivity between the clad layers and the guide layers. The n-type contact layer 3 is an underlying layer formed as the current path because the sapphire substrate is not electrically conductive at all. The buffer layer 2 grown at low temperatures is formed so as to deposit a flat film on the sapphire substrate that is a foreign material to GaN.

The steps (1)–(19) for manufacturing the laser device according to the above embodiment are described below in detail.

(1) The sapphire substrate 1 is put in a reactor of a metalorganic chemical vapor deposition (MOCVD) apparatus. Next, this substrate is held in a hydrogen flow of 300 Torr at 1050° C. for 10 minutes for thermal cleaning of the surface of the sapphire substrate 1. The sapphire substrate 1 is cooled to 400° C. Then ammonia ($NH_3$) as the nitrogen source and trimethyl aluminum (TMA) as the aluminum (Al) source are introduced in the reactor, and the low-temperature deposited buffer layer 2 made of AlN is deposited 50 nm in thickness.

(2) The supply of TMA is now suspended and the sapphire substrate 1 where the buffer layer 2 has been deposited is again heated to 1050° C., with only $NH_3$ supply being continued. Trimethylgallium (TMG) is then introduced to deposit the n-type GaN contact layer 3. Methylsilane (Me-$SiH_3$) as the source of silicon(Si) that will be an n-type impurity is also introduced.

(3) When the n-type GaN contact layer 3 has grown 4 μm in thickness, TMA is introduced to deposit the n-type $Al_{0.08}Ga_{0.92}N$ clad layer 4.

(4) When the n-type $Al_{0.08}Ga_{0.92}N$ clad layer 4 has grown as thick as 0.8 μm, the supply of TMA is suspended and then the n-type GaN guide layer 5 is grown 0.2 μm. When the growth of the n-type GaN guide layer 5 has been completed, the supply of TMG and Me—$SiH_3$ is suspended and then the substrate is cooled to 750° C.

(5) When the temperature of the substrate has reached 750° C., the carrier gas is changed from hydrogen to nitrogen. When the gas flow has been stabilized, TMG, TMI and Me—$SiH_3$ are introduced into the reactor to grow the barrier layer. Next, the supply of methylsilane is suspended and the supply of TMI is increased to grow the well layer of which In content will be higher than that in the barrier layer. The barrier layer and the well layer are deposited as many times as determined by the design of the multiple quantum well (MQW). The active layer 6 of the MQW structure is thereby formed.

(6) When the barrier layer is deposited on the last well layer of the active layer 6, the supply of TMG, TMI and Me—$SiH_3$ is suspended and the carrier gas is changed from nitrogen to hydrogen. When the gas flow has been stabilized, the substrate is again heated to 1050° C. and the p-type $Al_{0.2}Ga_{0.8}N$ electron barrier layer 7 is deposited 0.02 μm by introducing TMG, TMA and ethyl-cyclopentadienylmagnesium (Et-$Cp_2Mg$) as the source of magnesium(Mg) which will be a p-type impurity.

(7) Subsequently, the supply of TMA is suspended and the p-type GaN guide layer 8a on the active layer side is grown 0.1 μm. When the growth of the p-type GaN guide layer 8a on the active layer side is completed, the supply of TMG, and Et-$Cp_2Mg$ is suspended and then the substrate is cooled to 400° C.

(8) When the substrate temperature has reached 400° C., TMA is again introduced in the reactor and the current constricting AlN layer 8c is deposited 500 Å on the p-type GaN guide layer 8a on the active layer side.

(9) Subsequently, the supply of TMA and $NH_3$ is suspended and the substrate is cooled. When the substrate has reached room temperature, the wafer where the film layers have been deposited on the substrate 1 is taken out of the reactor.

Figure 2:
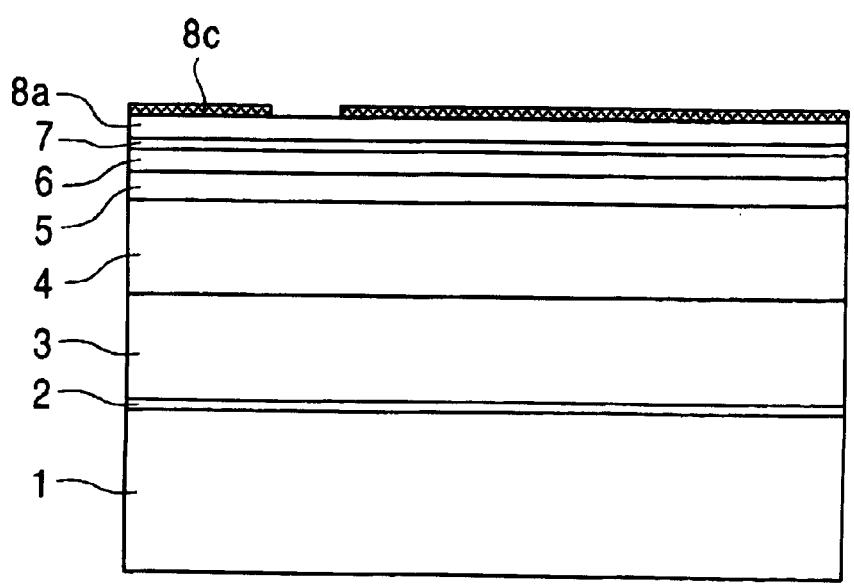
FIG. 2 is a schematic sectional view of a laser wafer provided by a semiconductor laser manufacturing method according to an embodiment of the present invention.

(10) Then a $SiO_2$ mask having an about 3 μm-wide stripe-shape aperture is patterned on the current constricting AlN layer 8c by the conventional photolithography process. The part of the current constricting AlN layer 8c exposed from the mask aperture is etched out in an aqueous solution of 5% or less tetramethylammoniumhydroxide ($N(CH_3)_4OH$) held at 80° C. for two minutes. Using hydrogen fluoride (HF), the $SiO_2$ mask is removed from the current constricting AlN layer 8c to form the stripe-shape aperture shown in FIG. 2. At this time, the p-type GaN guide layer 8a on the active layer side exposed from the stripe-shape aperture formed on the current constricting AlN layer 8c is not etched almost at all.

(11) Next, the wafer where the current constricting layer 8c made of AlN having the stripe-shape aperture has been formed is returned into the reactor of the MOCVD apparatus and then heated in the flow of hydrogen and $NH_3$.

(12) When the wafer temperature has reached 1050° C., TMG and Et-$Cp_2Mg$ are supplied to deposit the electrode-side p-type GaN guide layer 8b.

(13) When the electrode-side p-type GaN guide layer 8b has been grown to 0.1 μm, TMA is introduced to deposit the p-type $Al_{0.08}Ga_{0.92}N$ clad layer 9 as thick as 0.4 μm.

Figure 3:
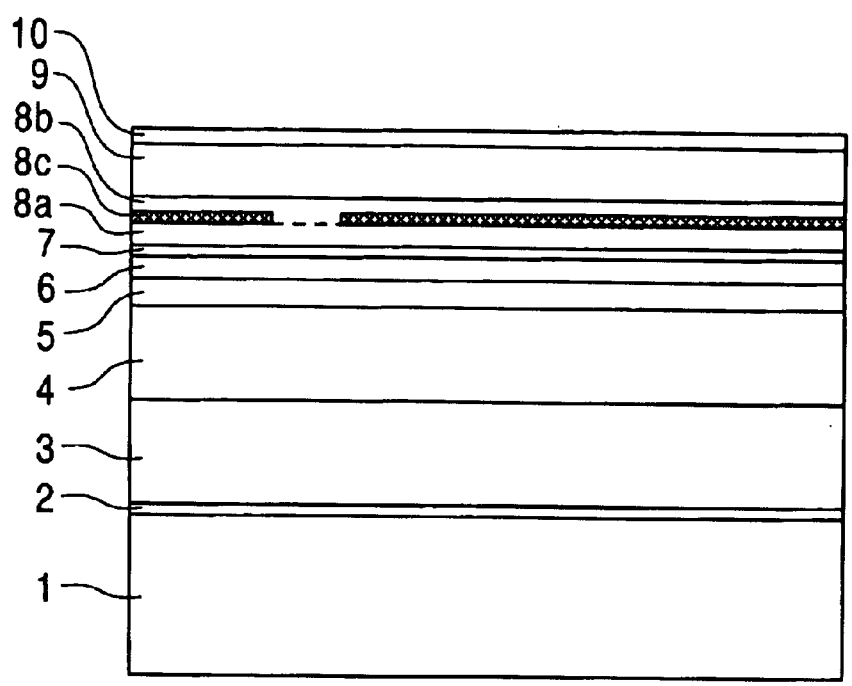
FIG. 3 is a schematic sectional view of the laser wafer provided by the semiconductor laser manufacturing method according to the embodiment of the present invention.

(14) Subsequently, the supply of TMA is suspended and, as shown in FIG. 3, the p-type GaN contact layer 10 is grown to 0.1 μm. When the growth of the p-type GaN contact layer 10 has been completed, the supply of TMG and Et-$Cp_2Mg$ is suspended and cooling is started.

(15) When the wafer temperature has reached 400° C., the supply of $NH_3$ is suspended. When the wafer has reached room temperature, the wafer is taken out of the reactor.

(16) The taken out wafer is heat-treated in a heat treatment furnace in the flow of nitrogen under atmospheric pressure at 800° C. for 20 minutes to be p-type.

Figure 4:
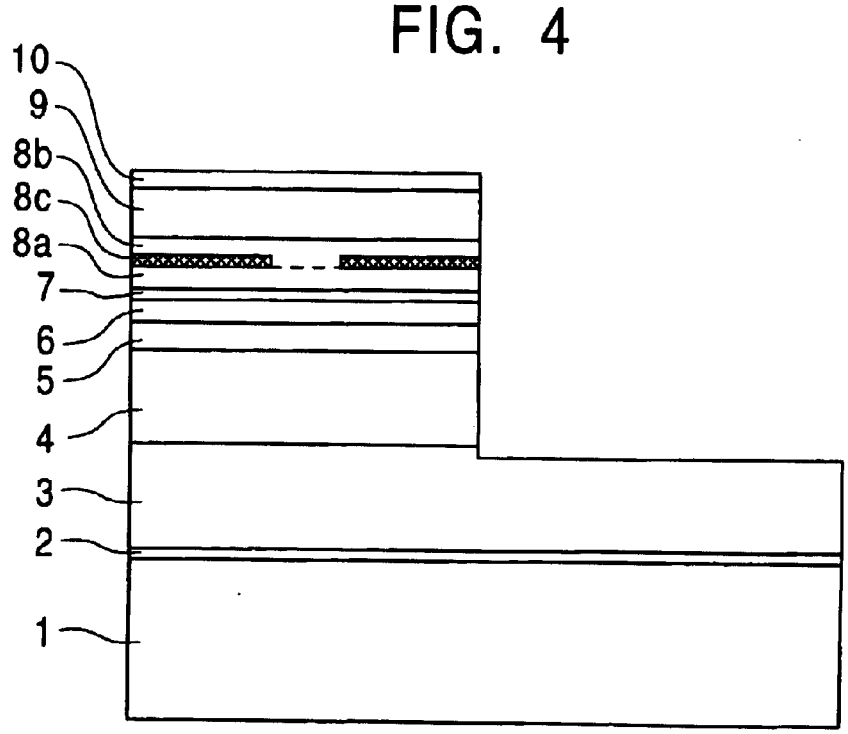
FIG. 4 is a schematic sectional view of the laser wafer provided by the semiconductor laser manufacturing method according to the embodiment of the present invention.

(17) Next, as shown in FIG. 4, a part of the n-type GaN contact layer 3 is exposed by the conventional dry etching to form the terrace for the n-side electrode and that for the p-side electrode.

On the thereby formed wafer, the $SiO_2$ dielectric film 11 is deposited by the sputtering method, for example. Later, windows for the p-side and n-side electrodes are formed on both terraces of the dielectric film 11 by the conventional photolithographic method. In the region where the n-type GaN contact later 3 is exposed, titanium (Ti) is deposited by evaporation as thick as 50 nm, then gold (Au) 200 nm to form the n-side electrode 14. In the region where the p-type GaN contact later 10 is exposed, nickel(Ni) is deposited by evaporation as thick as 50 nm, then Au 200 nm to form the p-side electrode 13. In this way, the device structure shown in FIG. 1 is formed in the respective regions on the wafer.

(18) Later, the sapphire on the wafer rear side is ground down to 100 µm or thinner and then cleaved into bars.

(19) Next, a highly reflective film is coated on the cleaved facet of the bar and the bar is cut into individual devices. The device is mounted on a heat sink with its p-side down.

Figure 5:
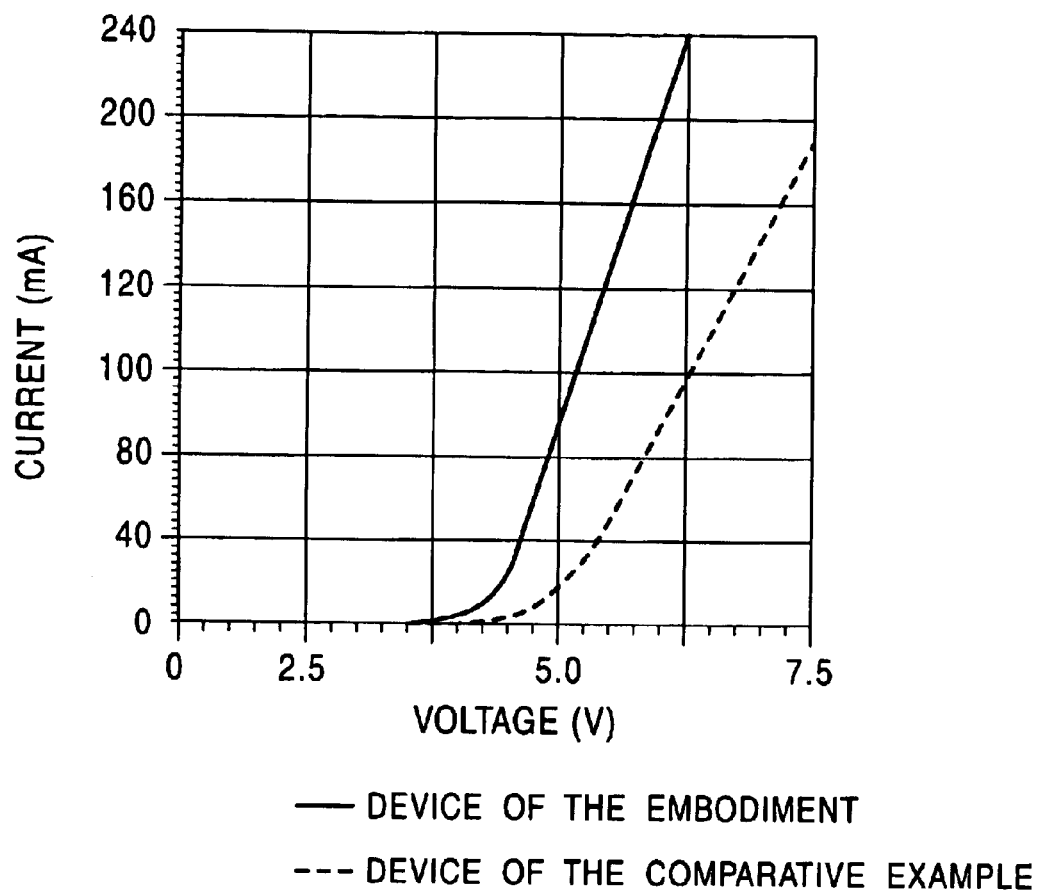
FIG. 5 is a graph illustrating the voltage-current properties of the semiconductor laser according to an embodiment of the present invention.

The current-voltage characteristics of the device fabricated according to the present invention were measured. FIG. 5 shows the measurement results (solid line). For comparison, measured were the current-voltage characteristics of a device that was fabricated in the same way as the above embodiment except that the electrode-side guide layer was not formed but only the clad layer made of $Al_{0.08}Ga_{0.92}N$;Mg was regrown (dotted line in FIG. 5). Comparing these characteristics, it is found that the turn-on voltage is lower in the device fabricated according to the embodiment. Besides, the voltage in the device of the present invention is lower about 1.5–2.0 volts than that in the device of the comparative example in the device operating current range 40–120 mA. Thus the device fabricated according to the present invention is advantageous in terms of operating voltage.

In addition, when the transverse mode of light was checked by observing the light emission property and FFP (far-field pattern) of the device of the present invention, the lasing threshold current was 46 mA, voltage 5V and half-width 7 degrees for the transverse FFP. The operation of the invented device was stable even after a continuous operation of 100 hours or longer at a light output power of 30 mW. This performance is high enough for practical use.

Figure 7:
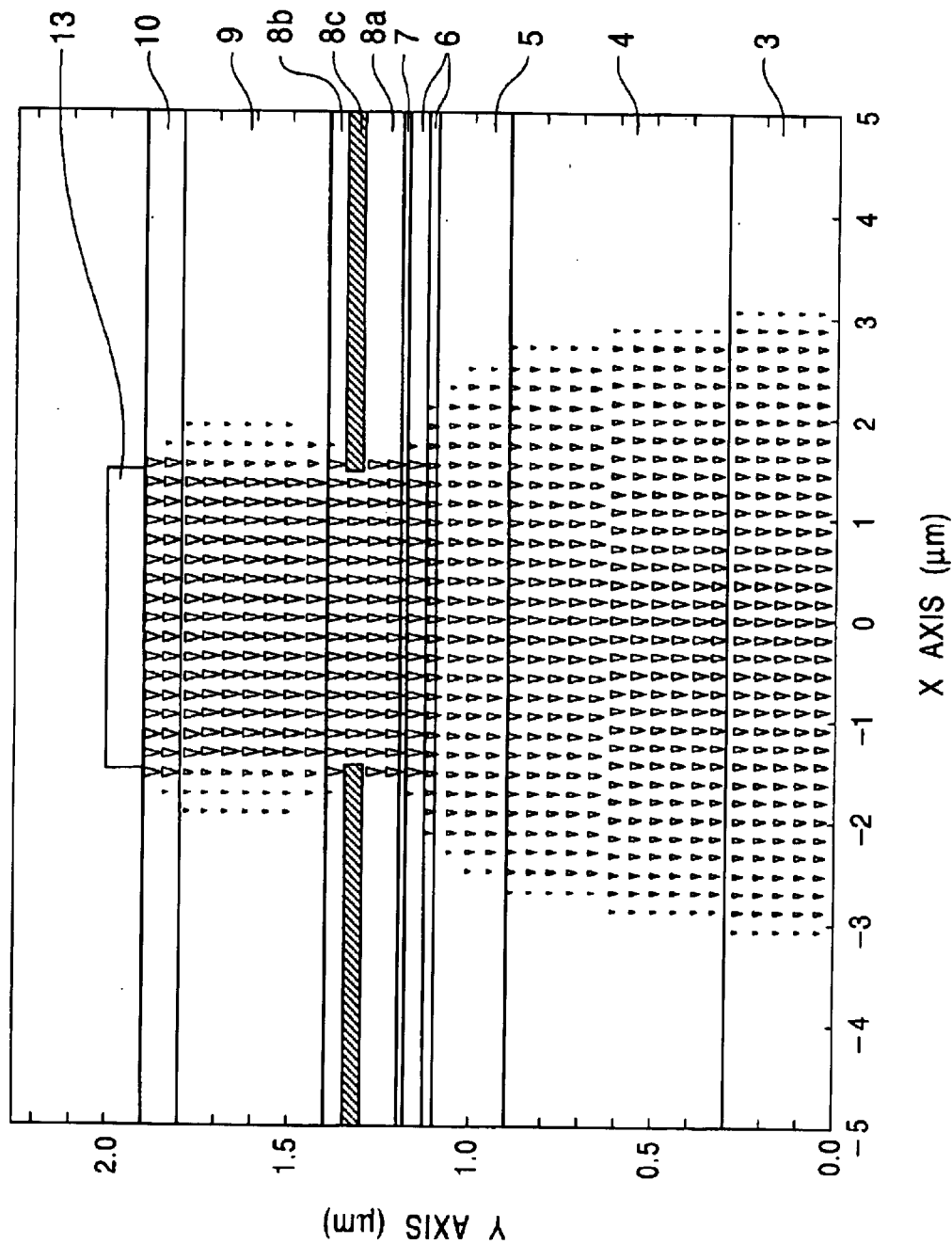
FIG. 7 is a schematic diagram demonstrating the simulation result of current flow constriction provided by the present invention.
Figure 8:
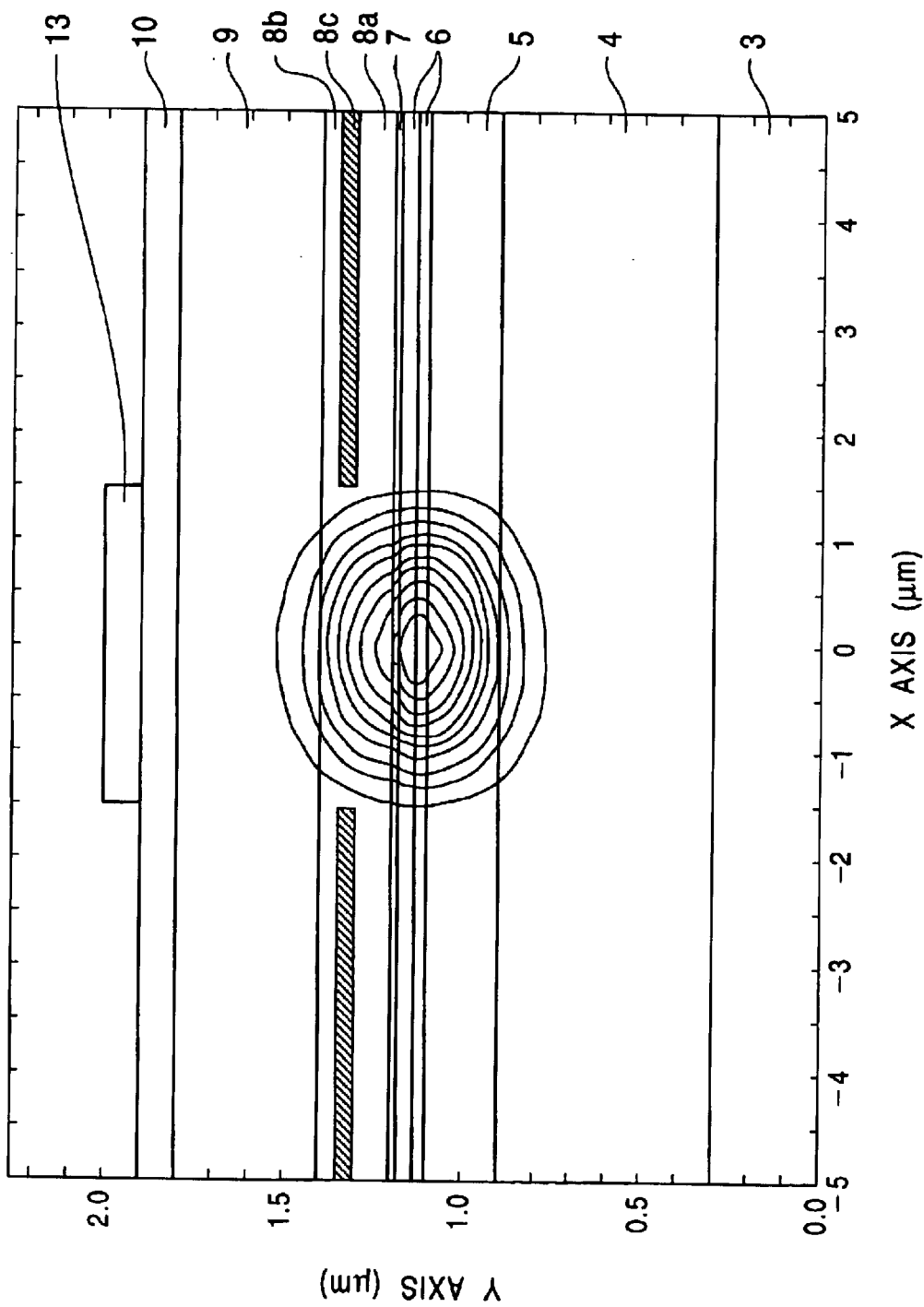
FIG. 8 is a schematic diagram demonstrating the simulation result of light confinement provided by the present invention.

A simulation study was conducted to confirm the current flow constriction and light confinement effects in the device of the present invention. The device structure was assumed to be the same as that of the above embodiment except that the film thickness of the p-type electrode-side guide layer was 500 Å. The composition of each layer was assumed to be the same as that of the embodiment. Also a simulation was conducted assuming that AlN had a refractive index of 2.15 and was a dielectric material. The simulation results are demonstrated in FIG. 7 and FIG. 8. Referring to FIG. 7 and FIG. 8, the horizontal axis (X-axis) represents the horizontal position in µm with reference to the center of the device, while the vertical axis (Y-axis) represents the relative position in µm in the direction the film layers are deposited.

FIG. 7 is a diagram showing the distribution of current density in a cross-section of the device. The size of each triangle represents the magnitude of current density. The diagram indicates that the current spread in the transverse direction in the active layer is restricted to the same width as that of the aperture of the current constricting layer made of AlN.

FIG. 8 is a diagram illustrating the strength distribution of electric field of light in the cross-section of the device with contour lines. If the strength of electric field of the most inward line is scaled 100, that of the most outward line is 10. Namely, 90% of the electric field generated in the active layer is concentrated in the area of the same width as that of the aperture of the current constricting layer made of AlN.

Figure 6:
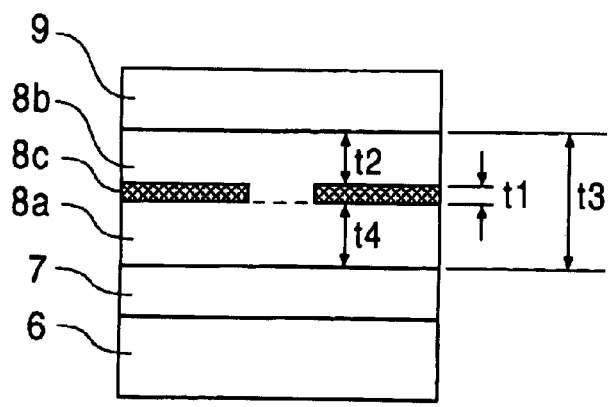
FIG. 6 is a schematic enlarged sectional view of the p-side guide laser of the semiconductor laser shown in FIG. 1.

The inventors have fabricated a number of devices and found a preferable range for the dimensions of the laser structure for the regions above the active layer. As shown in FIG. 6, with the active layer-side p-type GaN guide layer 8a, current constricting layer 8c and electrode-side p-type GaN guide layer 8b formed in this order on the p-type electron barrier layer or the cap layer 7 on the active layer 6 being t4, t1 and t2 in thickness, respectively, the total guide layer thickness t3 is given by $t3 \leq t1+t2+t4$. The range of film thickness t1 of the current constricting layer 8c should be $100 \text{ Å} \leq t1 \leq 800 \text{ Å}$, preferably $200 \text{ Å} \leq t1 \leq 600 \text{ Å}$. Film thickness t2 of the electrode-side p-type GaN guide layer 8b should be $(1/2)t1 \leq t2 \leq 2t1$, preferably $t1 \leq t2 \leq (3/2)t1$. Film thickness t4 of the active layer-side p-type GaN guide layer 8a should be $0 \leq t4 \leq 1000 \text{ Å}$. However, when film thickness t4 of the active layer-side p-type GaN layer guide layer 8a is zero, the p-type electron barrier layer or the cap layer 7 is formed and the current constricting layer 8c is deposited directly on this cap layer 7. The present invention includes the structure where the cap layer 7 is absent. The clad layer 9 deposited on the electrode-side p-type GaN guide layer 8b is preferably $Al_{u'}Ga_{1-u'}N$ ($0.05 \leq u' \leq 0.3$). The clad layer 9 may be an AlGaN/GaN super-lattice of which average AlN mole fraction u" falls in $0.05 \leq u'' \leq 0.3$.

In another embodiment, the chip mounting onto a heat sink in above step (19) may be done with the p-side up. The present invention is effective in terms of heat dissipation even when the chip is mounted with its p-side up. In the inner stripe type device, there is a heat conduction path where the heat generated in the active layer moves upward (p-side) and then dissipates downwards to the heat sink. Then if the current constricting layer is made of AlN, the thermal resistance of the chip can be lowered and thus the invention is advantageous with respect to heat dissipation even in the p-side up configuration. In this case, when the metallic p-side electrode film is thick, for example, 2 µm, the heat dissipation effect becomes great.

The substrate may be a material other than sapphire, for example, SiC, GaN, AlN and Si. If such a material is used, the buffer layer manufacturing conditions for the above step (1) may change. The other change is not significant; for example, the films deposited on the upper structure may change a little in thickness. If a conductive substrate such as SiC, GaN and Si is used, the n-type electrode may be formed on the backside of the substrate. In such a case, the step (17) for exposing the n-type contact layer by dry etching becomes unnecessary.

According to the present invention, since the current constricting layer formed inside the p-type guide layer over the active layer is made of AlN deposited at low temperatures, the current constricting layer has an appropriate low refractive index, a high thermal conductivity and a high electric resistance. With respect to manufacturing, the present invention makes it easy to perform wet etching and the regrowth layers on the current constricting layer. Also the current-voltage characteristics become excellent because the regrowth is performed from the p-type guide layer of which band gap is smaller than that of the p-type clad layer.

This application is based on Japanese Patent Application No. 2001-113904 which is herein incorporated by reference.

What is claimed is:

1. A nitride compound semiconductor laser having a plurality of crystal layers made of a group III nitride compound semiconductor expressed by the formula $(Al_xGa_{1-x})_{1-y}In_yN$ (where $0 \leq x \leq 1$, $0 \leq y \leq 1$), comprising:

an active layer-side guide layer being adjacent to an active layer in the crystal layers of said group III nitride compound semiconductor and made of $Al_{x'}Ga_{1-x'-y'}In_{y'}N$ (where $0 \leq x' \leq 1$, $0 \leq y' \leq 1$);

a current constricting AlN layer deposited on said active layer-side guide layer and having a stripe-shape aperture;

an electrode-side guide layer made of $Al_{x''}Ga_{1-x''-y''}In_{y''}N$ (where $0 \leq x'' \leq 1$, $0 \leq y'' \leq 1$) and deposited filling the aperture of said current constricting layer; and a clad layer that is made of $Al_uGa_{1-u-v}In_vN$ (where $0 \leq u \leq 1$, $0 \leq v \leq 1$) and deposited on said electrode-side guide layer.

2. The nitride compound semiconductor laser according to claim 1, wherein said current constricting layer is deposited at temperatures between 400° C.–600° C.

3. The nitride compound semiconductor laser according to claim 1, wherein a film thickness of said current constricting layer is 100 Å–800 Å.

4. The nitride compound semiconductor laser according to claim 3, wherein the film thickness of said current constricting layer is 200 Å–600 Å.

5. The nitride compound semiconductor laser according to claim 1, wherein said guide layer has a p-type conduction.

6. The nitride compound semiconductor laser according to claim 1, wherein said guide layer contains a group II element.

7. The nitride compound semiconductor laser according to claim 1, wherein a semiconductor layer made of $Al_zGa_{1-z}N$ (where $0.05 \leq z \leq 0.3$) is inserted between said active layer and said active layer-side guide layer.

8. The nitride compound semiconductor laser according to claim 1, wherein, band gaps of said active layer-side guide layer, said electrode-side guide layer and said clad layer are $Eg_1$, $Eg_2$ and $Eg_3$, respectively, where $Eg_1 \leq Eg_2 \leq Eg_3$.

9. A method for manufacturing a nitride compound semiconductor laser having a plurality of crystal layers made of a group III nitride compound semiconductor expressed by the formula $(Al_xGa_{1-x})_{1-y}In_yN$ (where $0 \leq x \leq 1$, $0 \leq y \leq 1$), comprising the steps of:

forming a current constricting AlN layer on an active layer-side guide layer being adjacent to an active layer in the crystal layers of said group III nitride compound semiconductor and made of $Al_{x'}Ga_{1-x'-y'}In_{y'}N$ (where $0 \leq x' \leq 1$, $0 \leq y' \leq 1$);

forming a stripe-shape aperture in said current constricting layer;

burying said current constricting layer with an electrode-side guide layer made of $Al_{x''}Ga_{1-x''-y''}In_{y''}N$ (where $0 \leq x'' \leq 1$, $0 \leq y'' \leq 1$); and forming a clad layer made of $Al_uGa_{1-u-v}In_vN$ (where $0 \leq u \leq 1$, $0 \leq v \leq 1$) on said electrode-side guide layer.

10. The manufacturing method according to claim 9, wherein growth of said crystal layers is performed by metalorganic chemical vapor deposition.

11. The manufacturing method according to claim 9, wherein a semiconductor layer made of $Al_zGa_{1-z}N$ (where $0.05 \leq z \leq 0.3$) is grown prior to the step of forming said active layer-side guide layer.

12. The manufacturing method according to claim 9, wherein said current constricting layer is deposited at temperatures between 400° C.–600° C. in the step of forming said current constricting layer.

13. The manufacturing method according to claim 9, wherein the step of forming said current constricting layer includes the step of wet-etching said current constricting layer to form a stripe-shape aperture.

14. The nitride compound semiconductor laser according to claim 2, wherein a film thickness of said current constricting layer is 100 Å–800 Å.

15. The manufacturing method according to claim 10, wherein a semiconductor layer made of $Al_zGa_{1-z}N$ (where $0.05 \leq z \leq 0.3$) is grown prior to the step of forming said active layer-side guide layer.

* * * * *